US008772880B2

(12) United States Patent
Fukuda et al.

(10) Patent No.: US 8,772,880 B2
(45) Date of Patent: Jul. 8, 2014

(54) SEMICONDUCTOR INTEGRATED CIRCUIT DEVICE

(75) Inventors: Koji Fukuda, Chofu (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 68 days.

(21) Appl. No.: 13/500,636

(22) PCT Filed: Oct. 4, 2010

(86) PCT No.: PCT/JP2010/067346

§ 371 (c)(1),
(2), (4) Date: Jun. 16, 2012

(87) PCT Pub. No.: WO2011/043284

PCT Pub. Date: Apr. 14, 2011

(65) Prior Publication Data

US 2012/0249217 A1    Oct. 4, 2012

(30) Foreign Application Priority Data

Oct. 6, 2009    (JP) ................. 2009-232150

(51) Int. Cl.
*H01L 27/088* (2006.01)

(52) U.S. Cl.
USPC ........... 257/390; 257/173; 257/369; 257/107; 257/110; 257/E27.047; 257/E27.05; 257/E27.06; 257/E27.009; 327/436; 327/566; 327/534

(58) Field of Classification Search
CPC .... G11C 14/00; G11C 14/0063; G11C 11/14; G11C 11/412; G11C 5/147; H01L 27/0207; H01L 27/0262; H01L 27/0802; H01L 27/0811; H01L 27/1104

USPC .......... 257/173, 390, 107, 369; 365/148, 100, 365/46, 184, 226; 327/538

See application file for complete search history.

(56) References Cited

U.S. PATENT DOCUMENTS

| | | | |
|---|---|---|---|
| 6,825,504 B2 * | 11/2004 | Ishizuka et al. | 257/173 |
| 7,630,247 B2 * | 12/2009 | Noda | 365/185.18 |
| 2003/0169098 A1 * | 9/2003 | Otsuka | 327/538 |

(Continued)

FOREIGN PATENT DOCUMENTS

| | | |
|---|---|---|
| JP | 11-234109 A | 8/1999 |
| JP | 2001-274258 A | 10/2001 |
| JP | 2006-286990 A | 10/2006 |
| JP | 2009-218946 A | 9/2009 |

*Primary Examiner* — Jerome Jackson, Jr.
*Assistant Examiner* — Bo Fan
(74) *Attorney, Agent, or Firm* — Miles & Stockbridge P.C.

(57) ABSTRACT

A high-speed semiconductor integrated circuit device is achieved by adjusting an offset voltage. For example, dummy NMOS transistors MND1 (MND1*a* and MND1*b*) and MND2 (MND2*a* and MND2*b*) are connected to drain outputs of NMOS transistors MN1 and MN2 operated according to differential input signals Din_p and Din_n, respectively. The MND1 is arranged adjacent to the MN1, and a source of the MND1*a* and a drain of the MN1 share a diffusion layer. The MND2 is arranged adjacent to the MN2, and a source of the MND2*a* and a drain of the MN2 share a diffusion layer. The MND1 and the MND2 function as dummy transistors for suppressing variations in process of the MN1 and the MN2 and, and besides, they also function as means for adjusting the offset voltage by appropriately applying an offset-amount setting signal OFST to each gate to provide a capacitor to either the MN1 or the MN2.

18 Claims, 11 Drawing Sheets

(56) References Cited

U.S. PATENT DOCUMENTS

| | | | |
|---|---|---|---|
| 2006/0023488 A1* | 2/2006 | Yasuda et al. | 365/148 |
| 2009/0213650 A1* | 8/2009 | Noda | 365/184 |
| 2009/0231001 A1 | 9/2009 | Fukuda et al. | |

\* cited by examiner

SEMICONDUCTOR INTEGRATED CIRCUIT DEVICE

TECHNICAL FIELD

The present invention relates to a semiconductor integrated circuit device, and, more particularly, the present invention relates to a technique effectively applied to a differential circuit that adjusts an offset voltage.

BACKGROUND

For example, FIG. 2 in Patent Document 1 illustrates a structure in which, each of differential pairing transistors is configured of four partial transistors, these eight partial transistors are symmetrically arranged in a region of "four rows× two columns", and a dummy transistor is arranged in a region outside the arrangement region. In this manner, variations in process uniformly affect both of the differential pairing transistors, and therefore, device characteristics can be uniformed.

Also, FIG. 2 in Patent Document 2 illustrates a structure in which, four gates are regularly arranged on a diffusion layer region, and two gates on both outsides are for a dummy transistor and two gates therebetween are for a MOS transistor with a two-finger structure. This two-finger MOS transistor is for a tail current source in a differential amplifying circuit, a portion between the two gates is taken as a drain and each portion outside the two gates is taken as a source. Two dummy transistors located on both sides of the tail-current MOS transistor share the source of the tail-current MOS transistor. Their sources and drains are wired, and besides, their gates are wired to the drain of the tail-current MOS transistor, so that each dummy transistor becomes a capacitative element which is connected to the drain of the tail-current MOS transistor (that is, a common node of the differential amplifying circuit). These dummy transistors contribute to a reduction of variations in manufacture of MOS transistors, and besides, contribute to stabilization of the common node of the differential amplifying circuit. Therefore, performance in a small area can be improved.

Further, Patent Document 3 describes a structure in which, each of pairing elements configuring a differential circuit is independently formed in a diffusion layer region, and dummy elements are arranged in a vacant space in a periphery of these elements. In this manner, an input offset can be decreased, and besides, variations in dimension in the process can be decreased, so that the characteristics of the differential circuit with a designed value can be obtained.

Patent Document 1: Japanese Patent Application Laid-Open Publication No. 2001-274258
Patent Document 2: Japanese Patent Application Laid-Open Publication No. 2006-286990
Patent Document 3: Japanese Patent Application Laid-Open Publication No. H11-234109

BRIEF DESCRIPTION OF THE DRAWINGS

FIG. 1A is a circuit diagram illustrating an example of a structure of a principal part of the semiconductor integrated circuit device, and FIG. 1B is a schematic diagram illustrating an example of a layout structure of FIG. 1A;

FIG. 10A is a circuit diagram illustrating an example of a structure of a principal part thereof, and FIG. 10B is a diagram illustrating an example of a layout structure of FIG. 10A; FIGS. 11A and 11B are circuit diagrams illustrating different methods from each other.

DETAILED DESCRIPTION

For example, in a differential circuit, in order to reduce an offset voltage accompanied with mismatch of the differential pairing transistors, a layout is made in consideration of symmetry of the differential pairing transistors as described in, for example, Patent Documents 1 to 3. At this time, a method of arranging the dummy transistor is used in order to keep the symmetry including a peripheral environment of each transistor (for example, a local density of polysilicon), to reduce an influence of the LOD (length of diffusion) effect, and for other purposes.

Figure 9:
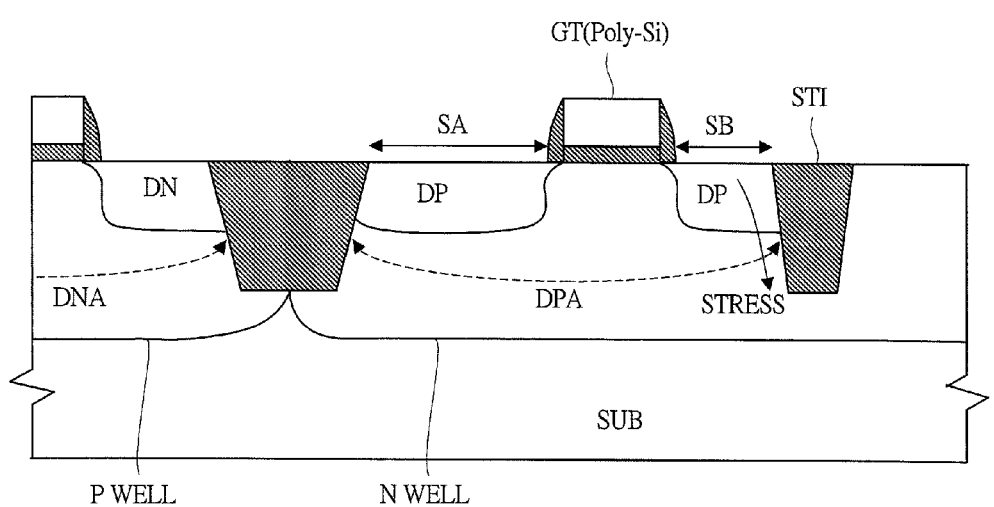
FIG. 9 is a diagram explaining the LOD effect.

FIG. 9 is a diagram explaining the LOD effect. The LOD effect is a phenomenon of degradation of a transistor performance as a distance (SA, SB) from an end of a gate GT of the transistor to an end of a diffusion layer region DPA is smaller. As illustrated in FIG. 9, the diffusion layer region DPA and another diffusion layer region DNA are separated with an insulating layer STI (Shallow Trench Isolation). The STI is formed by holing a semiconductor substrate SUB by etching, and then, burying $SiO_2$ or others therein. In order to secure an aspect ratio of the STI, anisotropic etching is required, and a physical method such as FIB (Focused Ion Beam) is mainly used. At this time, residual stress remains in a portion of the substrate near the hole. When ion implantation is performed to generate a diffusion layer DP after a gate GT is generated, an ion concentration of the diffusion layer DP is not uniformed due to this residual stress, and therefore, stable characteristics cannot be obtained. Therefore, particularly in a transistor such as a differential circuit to be operated at a high frequency and high speed, it is desired to arrange the gate of the dummy transistor on both sides of a gate of a normal transistor in order to suppress the influence of this LOD effect.

Figure 10A:
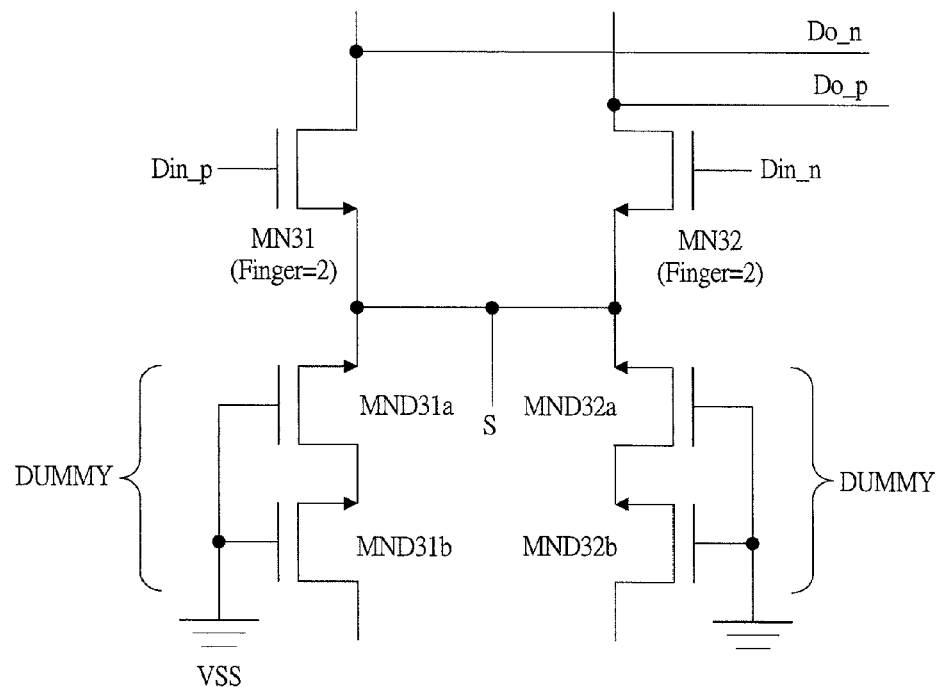
FIGS. 10A and 10B illustrate a semiconductor integrated circuit device studied as a premise of the present invention.
Figure 10B:
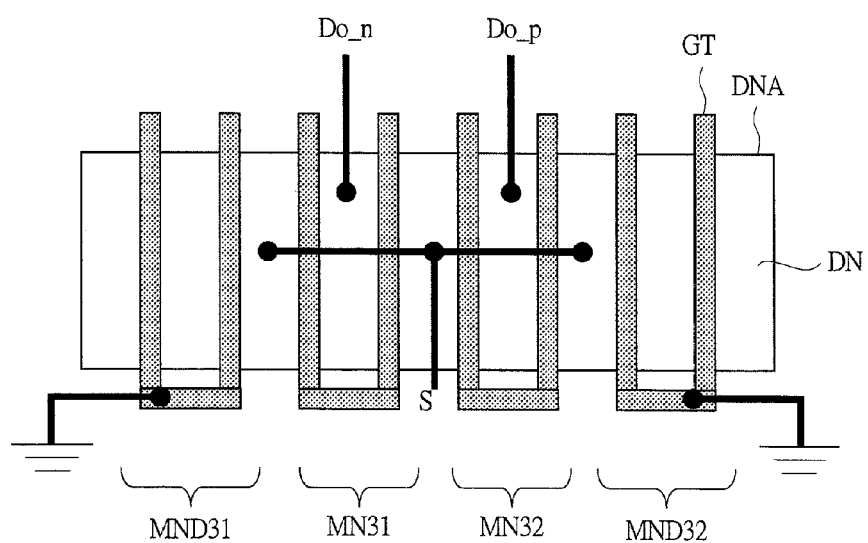

FIGS. 10A and 10B illustrate a semiconductor integrated circuit device studied as a premise of the present invention, FIG. 10A is a circuit diagram illustrating an example of a structure of a principal part thereof, and FIG. 10B is a diagram illustrating an example of a layout structure of FIG. 10A. The semiconductor integrated circuit device illustrated in FIG. 10A includes: NMOS transistors MN31 and MN32 which are a differential pair; dummy NMOS transistors MND31a and MND32a each whose source is connected to a common source node (S) of the NMOS transistors; and dummy NMOS transistors MND31b and MND32b each whose source is connected to the drain of MND31a or MND32a. Each gate of the dummy NMOS transistors is connected to a ground power supply voltage VSS and is fixed at an off state.

As illustrated in FIG. 10B, MN31 and MN32 are transistors each having a multi-finger (here, two-finger) structure, and are arranged to be adjacent to each other at a center portion inside an N-type diffusion layer region DNA. A diffusion layer DN between MN31 and MN32 and diffusion layers DN on their both outsides are a common source node (S), and diffusion layers DN between the two fingers in MN31 and MN32 are drain nodes for outputting differential output signals Do_n and Do_p, respectively. Also, MND31a is arranged on an end portion on the MN31 side inside DNA so as to share the source node with MN31, and MND31b is further arranged adjacently to its end. Similarly, MND32a is arranged on an end portion on the MN32 side inside DNA so as to share the source node with MN32, and MND32b is further arranged adjacently to its end.

By using such an example of the layout structure, the peripheral environment of MN31 and MN32 are uniformed because of the arrangement of the dummy NMOS transistors MND31 and MND32, and therefore, the variations in process of MN31 and MN32 are equalized and the offset voltage can be reduced. Also, by the arrangement of MND31 and MND32, MN31 and MN32 are separated from the ends of the diffusion layer region DNA each other, and therefore, the LOD effect can be suppressed. Further, by arranging the layout so that the end portion sides of DNA are the sources of MN31 and MN32, the dummy NMOS transistors function as capacitors provided to the common source node, and therefore, no operational side effect particularly occurs. Note that, in a point of view of reduction of a gate resistance or others, it is desired to use the multi-finger structure as described above for the transistor requiring the high speed performance such as the differential pairing transistor.

By using the differential circuit as illustrated in FIGS. 10A and 10B, relatively good characteristics can be obtained. However, in recent years, since high speed and microfabrication have been dramatically advanced, an influence of even a minute offset voltage on differential characteristics is not negligible. Accordingly, in order to adjust the offset voltage, for example, the following method can be considered.

Figure 11A:
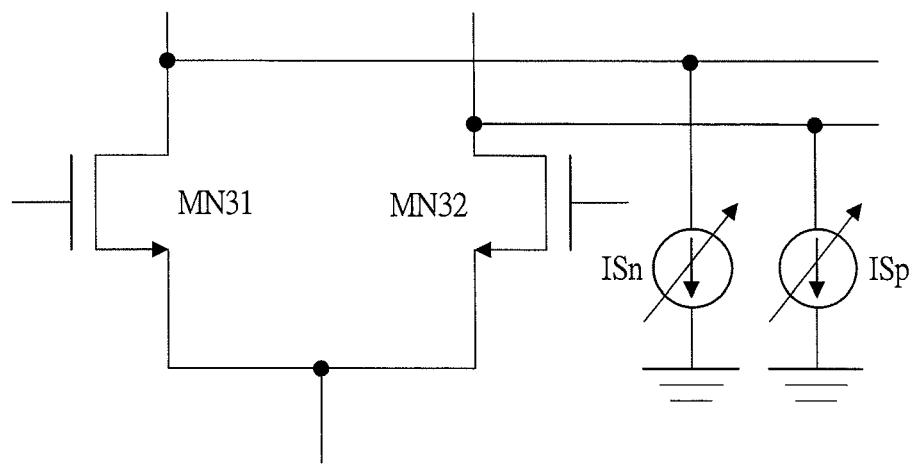
FIGS. 11A and 11B illustrate examples of a method of adjusting an offset voltage of the semiconductor integrated circuit device studied as a premise of the present invention.
Figure 11B:
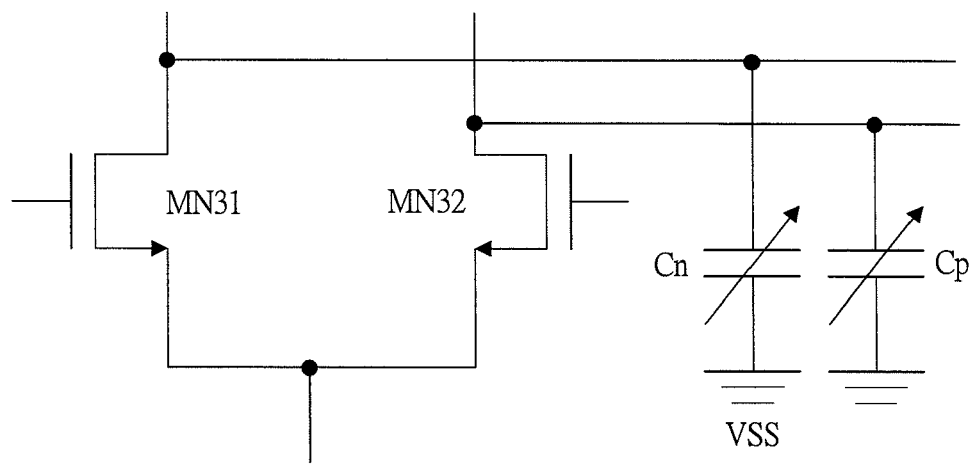

FIGS. 11A and 11B illustrate each example of a method of adjusting the offset voltage in the semiconductor integrated circuit device studied as a premise of the present invention, and are circuit diagrams illustrating different methods. FIG. 11A illustrates a method of adjusting the offset voltage by a current amount which is obtained by connecting variable current sources ISn and ISp to the respective drains of NMOS transistors MN31 and MN32 which are the differential pair. This method is useful when DC correction with collecting so-called DC offset voltages is performed. In ISn and ISp, a relatively large transistor area (gate width W) is required, and therefore, they are normally formed in a different diffusion layer region from the diffusion layer region where MN31 and MN32 are formed.

On the other hand, FIG. 11B illustrates a method of adjusting the offset voltage by a capacitance value which is obtained by connecting variable capacitors Cn and Cp to the respective drains of the NMOS transistors MN31 and MN 32 which are the differential pair. As different from the case of FIG. 11A, this method is used for AC correction of the offset voltages. That is, the DC offset voltages cannot be collectively corrected by this method. However, from a point of view of minute time, the DC offset voltages can be equivalently corrected by making a difference in signal transition time of differential output signals depending on the capacitor. And, more particularly, this method is useful for the purpose of the high speed. This variable-capacitor method is advantageous compared with the above-described variable current source method in point of views of power consumption and the circuit area. Further, in a different point of view, when it is desired to dynamically change the offset voltage during operation, this method is advantageous since a high response speed can be obtained compared with the variable current source method.

The present invention has been made in consideration of such a matter, and one preferred aim of the invention is to achieve a high-speed semiconductor integrated circuit device by adjusting an offset voltage. Also, that is to achieve the adjustment of the offset voltage in a small area. The above and other preferred aims and novel characteristics of the present invention will be apparent from the description of the present specification and the accompanying drawings.

Outlines of typical embodiments of the inventions disclosed in the present application will be briefly described as follows.

A semiconductor integrated circuit device according to the present embodiment includes: first and second MIS transistors which receive one and the other differential input signals; and third and fourth MIS transistor groups which have the same conductive type as those of the first and second MIS transistors and which are connected to respective drains of the first and second MIS transistors. The third MIS transistor group includes a plurality of transistors whose source-drain paths are connected in series, one end of the series-connected path is connected to the drain of the first MIS transistor, and the other end thereof is open-end. Similarly, the fourth MIS transistor group includes a plurality of transistors whose source-drain paths are connected in series, one end of the series-connected path is connected to the drain of the second MIS transistor, and the other end thereof is open-end.

When such a structure is used, by appropriately controlling a gate voltage of each transistor configuring the third and fourth MIS transistors, a predetermined capacitor can be provided to the drain of the first MIS transistor or the drain of the second MIS transistor, and therefore, the offset voltage between the first and second MIS transistors can be equivalently adjusted. More specifically, when a transistor in the third MIS transistor group which is connected to the drain of the first MIS transistor is set as a third A transistor and a transistor in the fourth MIS transistor group which is connected to the drain of the second MIS transistor is set as a fourth A transistor, for example, by driving either the third A transistor or the fourth A transistor so as to be turned on, the capacitance can be provided to its corresponding side.

In this manner, for example, the offset voltage or others can be reduced, and therefore, the high speed of the semiconductor integrated circuit device can be achieved. Further, by using a first diffusion layer serving as the drain of the first MIS transistor to be shared as a diffusion layer of the third A transistor and using a second diffusion layer serving as the drain of the second MIS transistor to be shared as a diffusion layer of the fourth A transistor, the adjustment of the offset voltage can be achieved with high accuracy.

Also, it is desired to lay out the above-described semiconductor integrated circuit device as follows. First, the gate of the first MIS transistor and the gate of the second MIS transistor are arranged adjacently to each other, and a common source region is arranged therebetween. Here, a first diffusion layer facing the common source region so as to interpose the first MIS transistor therebetween is set as the drain of the first MIS transistor, and a second diffusion layer facing the common source region so as to interpose the second MIS transistor therebetween is set as the drain of the second MIS transistor. Then, the gate of the third A transistor is arranged so as to share the first diffusion layer with the gate of the first MIS transistor, and each gate of rest of the transistors in the third MIS transistor group is arranged sequentially therefrom and adjacently thereto. Similarly, the gate of the fourth A transistor is arranged so as to share the second diffusion layer with the gate of the second MIS transistor, and each gate of rest of the transistors in the fourth MIS transistor group is arranged sequentially therefrom and adjacently thereto.

By using such a layout, the third and fourth MIS transistor groups can be functioned as dummy transistors of the first and second MIS transistors, and therefore, the offset voltage can be reduced. Note that, even by this, the minute offset voltage is caused. However, this voltage can be further reduced by controlling each gate voltage of the third and fourth MIS transistor groups as described above. In this manner, the speed of the semiconductor integrated circuit device can be increased. Also, as described above, since the third and fourth MIS transistor groups are operated as both of a dummy transistor function and an offset voltage adjusting function, the area can also be decreased. Further, when it is desired to adjust the offset voltage dynamically, its response speed can be improved by the above-described sharing structure of the first diffusion layer and the second diffusion layer.

The effects obtained by typical aspects of the present invention disclosed in the present application will be briefly described as follows. By adjusting an offset voltage, a high-speed semiconductor integrated circuit device can be achieved. Also, the offset voltage can be adjusted in a small, space-saving area.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, circuit elements configuring each functional block of the embodiments are not particularly limited, but are formed on a semiconductor substrate made of monocrystalline silicon or others by a publicly-known integrated circuit technique such as CMOS (complementary MOS transistor). Note that, in the embodiments, a MOS (Metal Oxide Semiconductor) transistor is used as an example of a MISFET (Metal Insulator Semiconductor Field Effect Transistor). In the drawings, a circle symbol is provided to a gate of a P-channel-type MOS transistor (PMOS transistor) so as to be differentiated from an N-channel-type MOS transistor (NMOS transistor). Although connection of substrate potentials of the MOS transistors is not clearly illustrated in the drawings, a method of the connection is not particularly limited as long as the MOS transistors can operate normally.

Hereinafter, embodiments of the present invention will be described in detail with reference to the accompanying drawings. Note that the same components are denoted by the same reference symbols in principle throughout all drawings for describing the embodiments, and the repetitive description thereof will be omitted.

(First Embodiment)

Figure 1A:
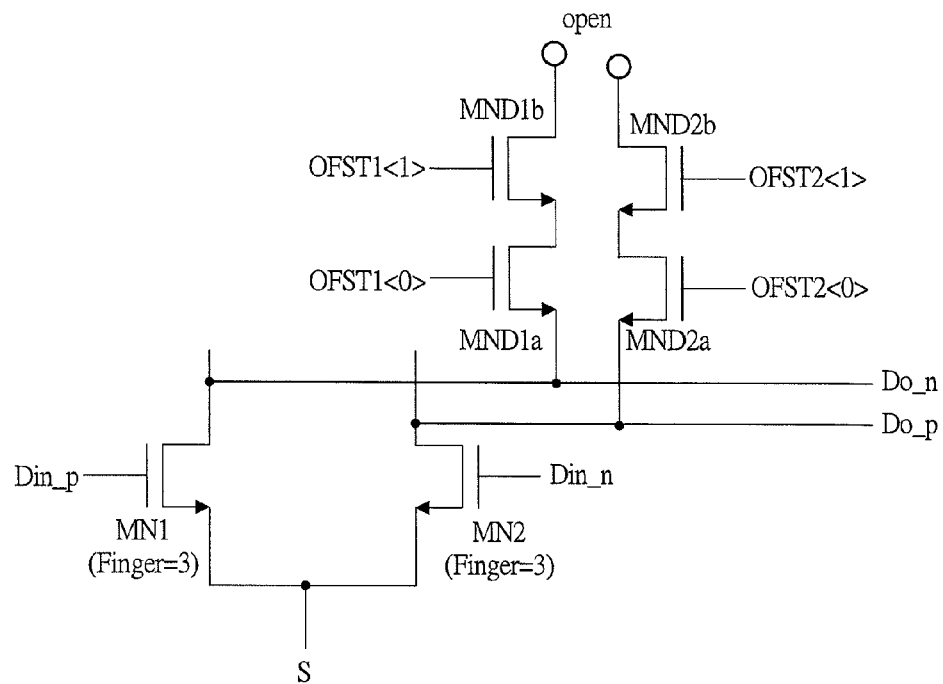
FIGS. 1A and 1B illustrate a semiconductor integrated circuit device according to a first embodiment of the present invention.
Figure 1B:
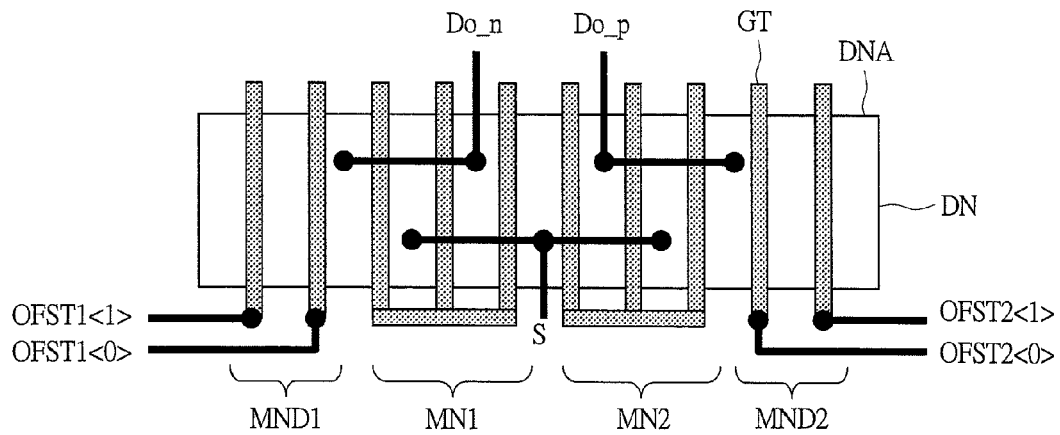

FIGS. 1A and 1B illustrate a semiconductor integrated circuit device according to a first embodiment of the present invention, FIG. 1A is a circuit diagram illustrating an example of a structure of a principal part thereof, and FIG. 1B is a schematic diagram illustrating an example of a layout structure of FIG. 1A. The semiconductor integrated circuit device illustrated in FIG. 1A includes: NMOS transistors MN1 and MN2 whose sources are connected to a common source node (S) and which are a differential pair; dummy NMOS transistors MND1$a$ and MND2$a$ whose sources are connected to drains of MN1 and MN2, respectively; and dummy NMOS transistors MND1$b$ and MND2$b$ whose sources are connected to drains of MND1$a$ and MND2$a$, respectively.

In MN1, a positive differential input signal Din_p is inputted to its gate, and a negative differential output signal Do_n is outputted from its drain. In MN2, a negative differential input signal Din_n is inputted to its gate, and a positive differential output signal Do_p is outputted from its drain. To the gates of MND1$a$ and MND1$b$, offset-amount setting signals OFST1<0> and OFST1<1> are inputted, respectively. To the gates of MND2$a$ and MND2$b$, offset-amount setting signals OFST2<0> and OFST2<1> are inputted, respectively. Also, both of the drains of the MND1$b$ and MND2$b$ are open-end. Here, note that, while the source and the drain of the dummy NMOS transistor are differentiated from each other for convenience, they are not necessarily particularly differentiated from each other in practice.

As illustrated in FIG. 1B, MN1 and MN2 are transistors each with a multi-finger (here, fingers formed of three gates GT) structure, and are arranged adjacent to each other at a center portion inside an N-type diffusion layer region DNA. The diffusion layer DN between MN1 and MN2 serves as the common source node (S), and a diffusion layer DN facing this diffusion layer so as to interpose the three-gate fingers of MN1 therebetween serves as the drain which outputs Do_n. Also, a diffusion layer DN facing the diffusion layer DN between MN1 and MN2 so as to interpose the three-gate finger of MN2 serves as the drain which outputs Do_p. Of two diffusion layers DN which are within the three-gate fingers in MN1, the one close to a center of DNA is connected to the drain, and the one close to an end thereof is connected to the source. Of two diffusion layers DN which are within the three-gate fingers in MN2, the one close to a center of DNA is connected to the drain, and the one close to an end thereof is connected to the source.

Also, MND1$a$ is arranged at an end portion on the MN1 side in DNA so as to share the diffusion layer DN of the drain on the end side of MN1 as a source, and MND1$b$ is arranged adjacently to a further end thereof. Similarly, MND2$a$ is arranged at an end portion on the MN2 side in DNA so as to share the diffusion layer DN of the drain on the end side of MN2 as a source, and MND2b is arranged adjacently to a further end thereof. Each dummy NMOS transistor has the same conductive type as those of the normal NMOS transistors (MN1 and MN2), and is formed to have sizes with the same gate length and gate width per gate finger in each of MN1 and MN2.

When such an example of the layout structure is used, the peripheral environment of MN1 and MN2 are equalized by the arrangement of the dummy NMOS transistors MND1 and MND2, and therefore, the variations in process on MN1 and MN2 are equalized, and the offset voltage can be reduced. Also, by the arrangement of MND1 and MND2, a distance between the end of the diffusion layer region DNA and MN1 or MN2 is lengthened, and therefore, the LOD effect can be suppressed. Further, by providing a layout such that the end sides of DNA are the drains of MN1 and MN2 with setting the number of gate fingers of the differential pairing transistor as an odd number, the dummy NMOS transistors can be functioned as the capacitors provided to the differential output nodes (Do_n and Do_p). In this manner, as described in FIG. 11B, the offset adjustment with the variable-capacitor method can be achieved, and the offset voltage can further be reduced, and others, so that the speed of the semiconductor integrated circuit device can be increased. This offset adjusting function will be described in detail below.

Figure 2A:
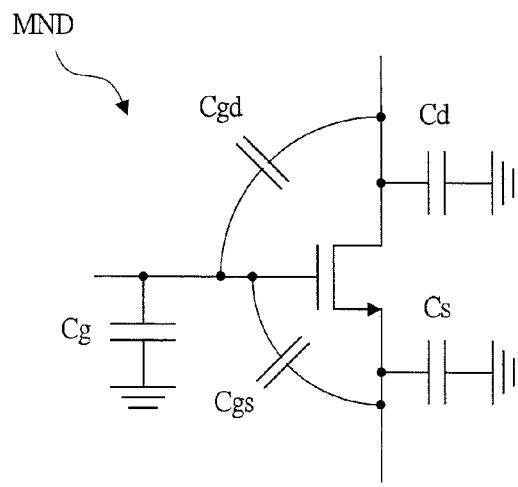
FIGS. 2A to 2C are diagrams for explaining an offset adjusting function of a dummy transistor of the semiconductor integrated circuit device of FIGS. 1A and 1B.
Figure 2B:
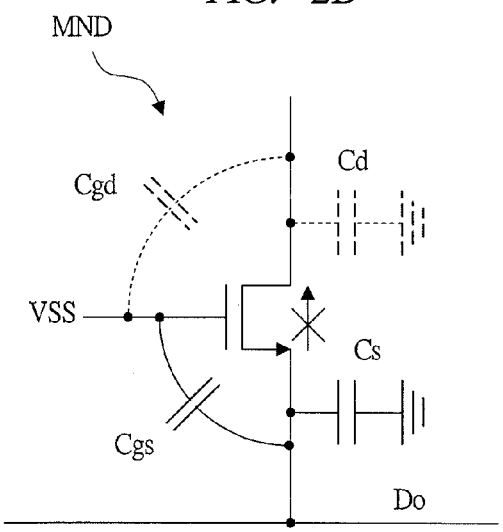
Figure 2C:
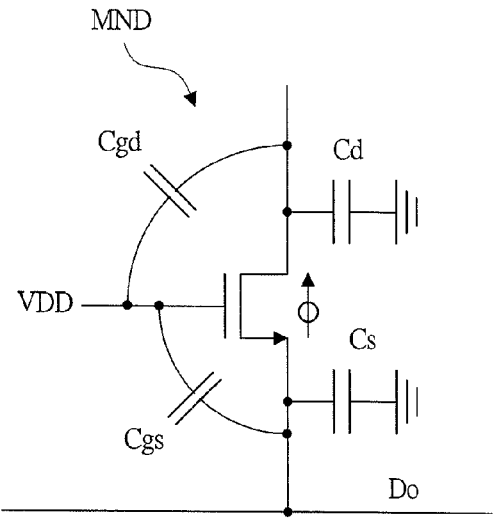

FIGS. 2A to 2C are diagrams for explaining the offset adjusting function of the dummy transistor in the semiconductor integrated circuit device of FIGS. 1A and 1B. As illustrated in FIG. 2A, a dummy NMOS transistor MND equivalently includes: a gate-source capacitor Cgs; a gate-drain capacitor Cgd; a source diffusion layer capacitor Cs; a drain diffusion layer capacitor Cd; and a gate insulating film capacitor Cg. Here, when a gate voltage to turn MND off (for example, a reference power supply voltage VSS) is applied, as viewed from the differential output node (Do), connection between Cgs and Cs is apparently the AC parallel connection, and Cgd and Cd disappear, as illustrated in FIG. 2B. Note that Cg is negligible since the gate voltage is a DC input.

On the other hand, when a gate voltage to turn MND on (for example, a power supply voltage VDD) is applied, as viewed from the differential output node (Do), connection between Cgs, Cs, Cgd, and Cd is AC parallel connection as illustrated in FIG. 2C. Therefore, in FIG. 1A, for example, when it is set that MND1a is turned on by the offset-amount setting signal OFST1<0>, the capacitors on the drain side of MND1a and the source side of MND1b are provided to Do_n. Further, when MND1b is turned on by OFST1<1>, the capacitor on the drain side of MND1b is further provided to Do_n. In this manner, a variable capacitor can be achieved.

Here, since this offset adjusting function also serves as a function as the dummy transistor as described above, the functions can be achieved in a small area and without area overhead. Further, this dummy transistor with the offset adjusting function is formed in a form of sharing the diffusion layer of the drain (differential output node) of the differential pairing transistor (MN1 and MN2). Therefore, when the capacitor is varied by the offset-amount setting signal OFST, this variation can be instantaneously reflected to the differential output node. This manner is useful particularly when it is desired to adjust the offset voltage dynamically.

Figure 3:
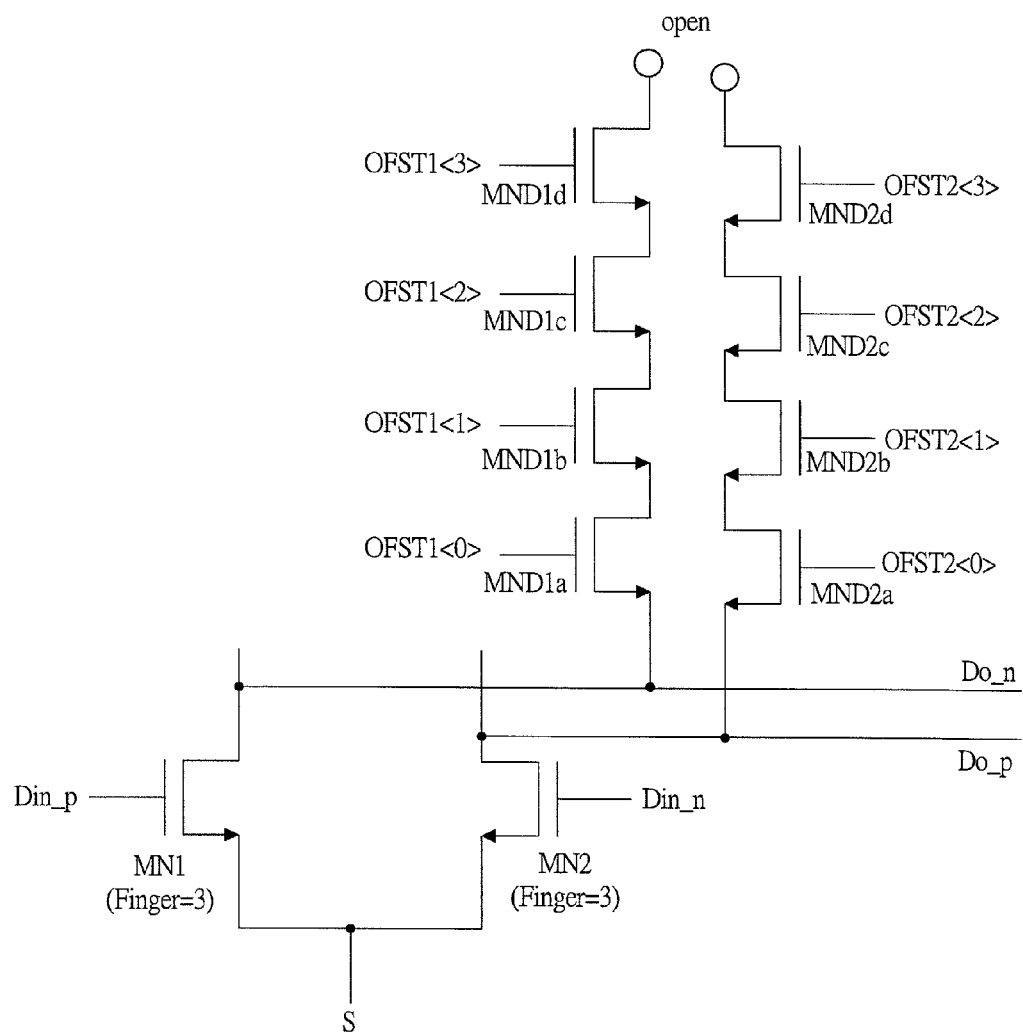
FIG. 3 is a circuit diagram illustrating an example of an enlarged structure of FIG. 1A.

FIG. 3 is a circuit diagram illustrating an example of an enlarged structure of FIG. 1A. In FIG. 1A, the offset adjusting circuit is configured of dummy NMOS transistors MND1a, MND1b, MND2a, and MND2b in the two-stage series connection. As a matter of course, as illustrated in FIG. 3, this can be configured of dummy NMOS transistors MND1a to MND1d and MND2a to MND2d in multi-stage (here, four-stage) series connection. In this case, the gate GT is further added to both end portions in the N-type diffusion layer region DNA in FIG. 1B. In this manner, an adjustment range of the offset amount can be further enlarged.

Also, as seen from FIGS. 2A to 2C, the offset adjusting circuit can be configured of one stage in some cases. Further, while the dummy NMOS transistors MND are controlled to be turned on and off in digital fashion here, they can be controlled in analog fashion in some cases. For example, by adjusting the gate voltage value in analog fashion, signal transition time can be controlled also by using a resistance value between the source and the drain or others. Note that the case of using the NMOS transistors as the differential pair is described here. However, it goes without saying that the present invention can be similarly applied even when PMOS transistors are used.

As described above, by using the semiconductor integrated circuit device of the first embodiment, typically, the speed can be increased with the reduction of the offset voltage. Also, the reduction of the offset voltage can be achieved in a small area. Further, even when it is desired to adjust the offset voltage dynamically at a high speed, the invention can sufficiently support this case.

(Second Embodiment)

Figure 4:
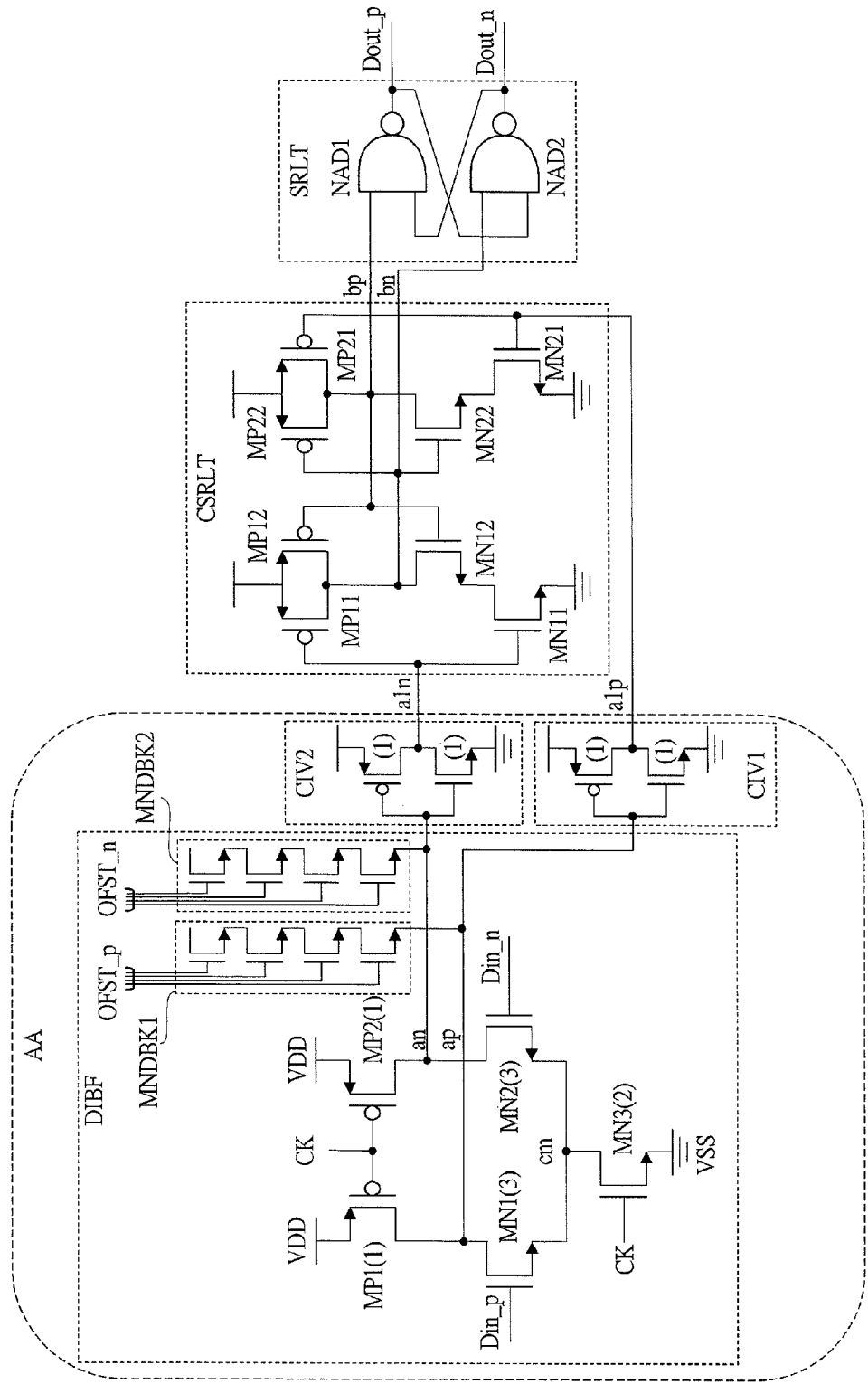
FIG. 4 is a circuit diagram illustrating an example of a structure of a semiconductor integrated circuit device according to a second embodiment of the present invention.

In a second embodiment, a case of applying the offset adjusting function described in the first embodiment to a flip-flop circuit is described. FIG. 4 is a circuit diagram illustrating an example of a structure of the semiconductor integrated circuit device according to the second embodiment of the present invention. The semiconductor integrated circuit device illustrated in FIG. 4 includes: a CMOS-type data input circuit DIBF; CMOS inverter circuits CIV1 and CIV2; a CMOS-type SR latch circuit CSRLT; and an SR latch circuit SRLT.

The data input circuit DIBF includes an NMOS transistor MN3 and PMOS transistors MP1 and MP2 in addition to the NMOS transistors MN1 and MN2 to which the respective differential input signals Din_p and Din_n are inputted and the dummy NMOS transistor groups MNDBK1 and MNDBK2 connected to the respective drains (ap and an) of MN1 and MN2 as described with FIGS. 1A and 1B or others. In MN3, its source is connected to a reference power supply voltage VSS, its drain is connected to a common source node (cm) of MN1 and MN2, and a clock signal CK is inputted to its gate. In MP1 and MP2, its source is connected to a power supply voltage VDD, and CK is inputted to its gate. The drain of MP1 is connected to the drain (ap) of MN1, and the drain of MP2 is connected to the drain (an) of MN2.

As described with FIGS. 1A and 1B or others, each of MNDBK1 and MNDBK2 is configured of a plurality of (here, four) dummy NMOS transistors MND which are connected in series. The CMOS inverter circuit CIV1 takes a drain (ap) signal of MN1 as a gate input, and outputs its inversion signal to an output node (a1p). The CIV2 takes a drain (an) signal of MN2 as a gate input, and outputs its inversion signal to an output node (a1n). Note that a numerical symbol in parentheses in FIG. 4 (for example, "3" of MN1(3)) indicates the number of gate fingers.

The CMOS-type SR latch circuit CSRLT includes: NMOS transistors MN11, MN12, MN21, and MN22; and PMOS transistors MP11, MP12, MP21, and MP22. The MP11 and the MN11 take the node (a1n) as a gate input, and the MP21 and the MN21 take the node (a1p) as a gate input. In the MP12, its source and drain are connected to the source and drain of MP11. In the MN12, its source is connected to the drain of MN11, and its drain is connected to the drain of the MP11 (MP12). Similarly, in the MP22, its source and drain are connected to the source and drain of MP21. In the MN22, its source is connected to the drain of MN21, and its drain is connected to the drain of the MP21 (MP22). And, the gates of MP12 and MN12 are connected to a drain (bp) of MP22 (MN22), and the gates of MP22 and MN22 are connected to a drain (bn) of MP12 (MN12). Note that the sources of MP11, MP12, MP21, and MP22 are connected to the power supply voltage VDD, and the sources of MN11 and MN21 are connected to the reference power supply voltage VSS.

The SR latch circuit SRLT is configured of two two-input NAND circuits NAD1 and NAD2. The NAD1 and NAD2 output differential output signals Dout_p and Dout_n, respectively. The NAD1 takes the node (bp) as one input and the Dout_n as the other input. The NAD2 takes the node (bn) as one input and the Dout_p the other input.

Figure 5:
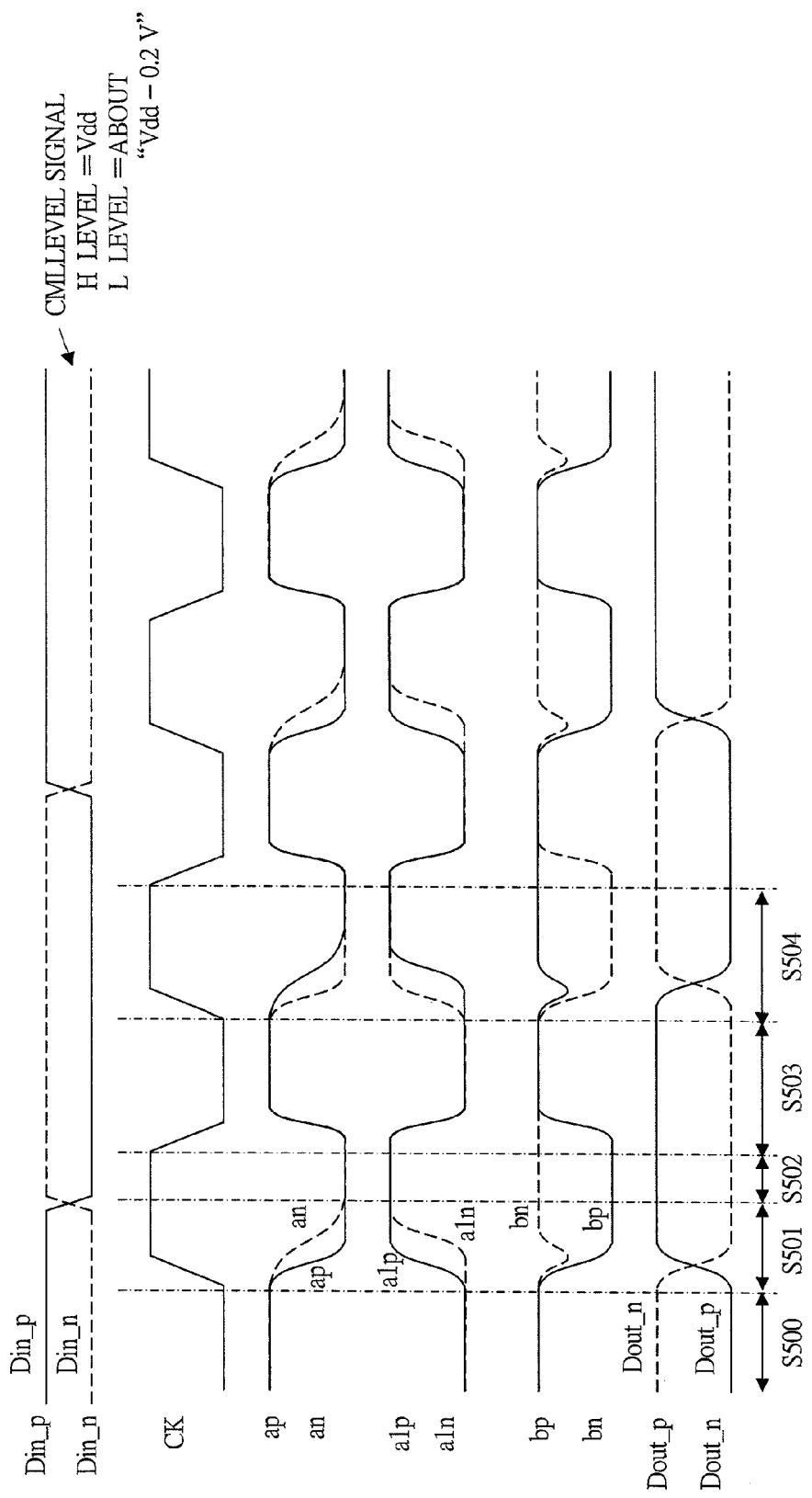
FIG. 5 is a waveform diagram illustrating an example of operation of the semiconductor integrated circuit device of FIG. 4.

FIG. 5 is a waveform diagram illustrating an example of operation of the semiconductor integrated circuit device of FIG. 4. First, in S500 of FIG. 5, when the clock signal CK is at an "L" level, the data input circuit DIBF charges the nodes (ap and an) at a VDD level via MP1 and MP2 regardless of values of the differential input signals Din_p and Din_n. In this manner, both of the nodes (a1$p$ and a1$n$) become at a VSS level via CIV1 and CIV2. In the CMOS-type SR latch circuit CSRLT, in response to this VSS level, the MP11 and MP21 are turned on, and the nodes (bp and bn) become at the VDD level. In response to this VDD level, while the MN12 and MN22 are turned on (the MP12 and MP22 are turned off), the MN11 and MN21 are still in the off state, and therefore, the nodes (bp and bn) is maintained at the VDD level. In response to this VDD level of these nodes (bp and bn), the state of the differential output signals Dout_p and Dout_n at that period are still maintained in the SR latch circuit SRLT.

Then, in S501 of FIG. 5, when the clock signal CK transits to an "H" level, in DIBF, the MP1 and MP2 are turned off, and the MN3 is turned on instead. In this manner, voltages of the nodes (ap and an) are discharged at different speeds in accordance with a voltage difference between the Din_p and Din_n. For example, when the Din_p is at the "H" (for example, VDD) level and the Din_n is at the "L" (for example, VDD-0.2 V) level, the node (ap) is first discharged to the VSS level, and, after passing a certain period, the node (an) is discharged to the VSS level. The signals of these nodes (ap and an) are waveform-shaped via an inverting operation performed by the CIV1 and CIV2, and these waveform-shaped signals are outputted to the nodes (a1$p$ and a1$n$). Here, during this certain period, the node (a1$p$) is at the VDD level and the node (a1$n$) is at the VSS level. In the CSRLT, the MN21 is turned on, the MP21 is turned off, the MN11 is turned off, and the MP11 is turned on. In this manner, the node (bn) is maintained at the VDD level, and the on state of the MN22 and the off state of the MP22 are maintained. However, the node (bp) is discharged to be the VSS level since the MN21 has transited to be the on state (MP21 has transited to be the off state). Then, the MP12 transits to be the on state, and the MN12 transits to be the off state. However, a charge path from the MP12 is merely added to a charge path from the MP11, and therefore, the node (bn) is still maintained at the VDD level. In response to the (VSS and VDD) levels of these nodes (bp and bn), SRLT turns the Dout_p to the "H" level and the Dout_n to the "L" level.

Next, in S502 of FIG. 5, when both of the nodes (a1$p$ and a1$n$) are at the VDD level after passing the above-described certain period, the MN11 transits to be the on state, and the MP11 transits to be the off state. However, since the MP12 is still at the on state and the MN12 is still at the off state, the node (bn) is still maintained at the VDD level, and the node (bp) is at the VSS level, and therefore, the states of the Dout_p and the Dout_n are not changed. Note that this certain period corresponds to a hold time. Even if the Din_p and the Din_n transit after passing the hold time, both of the nodes (ap and an) are maintained at the VSS level, and both of the nodes (a1$p$ and a1$n$) are maintained at the VDD level, and therefore, these transitions of the Din_p and the Din_n do not affect the operation.

Then, in S503 of FIG. 5, when the clock signal CK transits to the "L" level, the node (bp) transits to the VDD level, and besides, both of the nodes (bp and bn) are changed to the VDD level as described above. Also in this case, the states of the Dout_p and the Dout_n are maintained in the SR latch circuit SRLT. Then, in S504 of FIG. 5, when the CK transits to the "H" level again, the levels of the Dout_p and the Dout_n are determined in accordance with the voltage difference between the Din_p and the Din_n.

In this manner, the semiconductor integrated circuit device of FIG. 4 is a flip-flop circuit with a rising edge trigger of the clock signal CK. During the state that the CK is at the "L" level, the data input circuit DIBF (and the inverter circuits CIV1 and CIV2) output the "L" level to the two output nodes (a1$n$ and a1$p$). Also, in response to this, the CMOS-type SR latch circuit CSRLT outputs the "H" level to the two output nodes (bp and bn). With this "H" level, the output data is maintained in the SR latch circuit SRLT as it is. On the other hand, when the CK transits to the "H" level, the DIBF (and the CIV1 and the CIV2) output a different level depending on the input data to the output nodes for a certain period, and then, all of them output the "H" level. In other words, the input data is converted to a difference in discharge time between the two nodes. In response to the different level from the DIBF, the CSRLT outputs a different level in accordance with the response to the two output nodes, and then, in response to the "H" level, the output data is maintained as it is. In other words, the difference in discharge time between the two nodes is detected to latch information about which node has a shorter (longer) discharge time. In response to the different level from the CSRLT, the SRLT outputs a different level in accordance with the response to the two output nodes, and then, the output data is maintained in the CSRLT as it is, and therefore, an output data itself is also maintained as it is.

As described above, by using a method of converting a difference in amplitude between the differential input signals Din_p and Din_n with small amplitudes into the difference in discharge time and detecting and latching the difference, differential input signal with high speed can be supported. Further, a flow-through current does not flow through the data input circuit DIBF because the MP1, the MP2, and the MN2 are complementarily turned on by the clock signal CK, and besides, the CMOS-type SR latch circuit CSRLT has a structure not allowing to flow the flow-through current therethrough. Therefore, low power consumption of the flip-flop circuit can be achieved. However, when a high-speed operation is performed with such a differential input signal with small amplitude, the influence of even a minute offset voltage is not negligible.

Accordingly, by providing dummy NMOS transistor groups MNDBK1 and MNDBK2 as illustrated in FIG. 4, the offset voltage accompanied with the variations in process due to the layout can be reduced as described in the first embodiment, and besides, an offset voltage which still remains even with this reduction can be reduced by adjusting the offset voltage with the offset-amount setting signals OFST_p and OFST_n. Therefore, the offset voltage can be significantly reduced, and therefore, the further high speed can be achieved. More specifically, for example, when an offset voltage in a positive direction is in the Din_p as viewed from the Din_n as reference, the discharge speed of the node (ap) is excessively higher than that without the offset voltage, and therefore, there is a risk that an input margin in the CSRLT is decreased. In this case, by appropriately adjusting the OFSTp and providing the capacitor to the node (ap) by the MNDBK1, the excessive discharge speed can be decreased, and the offset voltage can be equivalently compensated.

Figure 6:
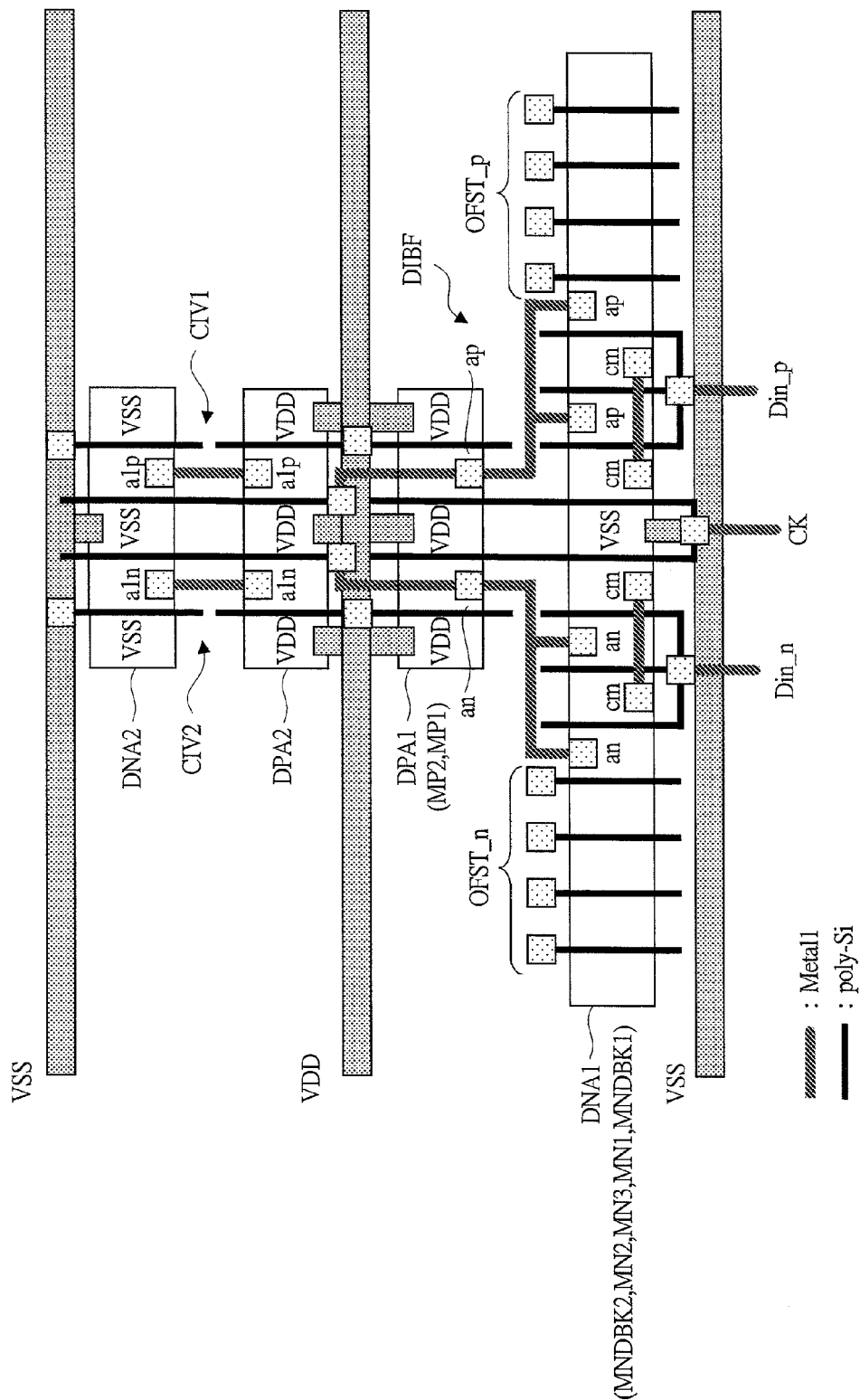
FIG. 6 is a schematic diagram illustrating an example of a layout structure of a part of the semiconductor integrated circuit device of FIG. 4.

FIG. 6 is a schematic diagram illustrating an example of a layout structure of a part of the semiconductor integrated circuit device of FIG. 4. Here, the example of the layout structure of the CMOS-type data input circuit DIBF and the CMOS inverter circuits CIV1 and CIV2 in FIG. 4 (a region "AA" in FIG. 4) is illustrated. In FIG. 6, two reference power supply voltage wirings (VSS) are parallely arranged to each other, and one power supply voltage wiring (VDD) is arranged between the two reference power supply voltage wirings (VDD) in parallel to them. Between one reference power supply voltage wiring (VSS) and the power supply voltage wiring (VDD), an N-type diffusion layer region DNA1 and a P-type diffusion layer region DPA1 are arranged adjacent to each other sequentially from the VSS side. Between the other reference power supply voltage wiring (VSS) and the power supply voltage wiring (VDD), a P-type diffusion layer region DPA2 and an N-type diffusion layer region DNA2 are arranged adjacent to each other sequentially from the VDD side.

In the N-type diffusion layer region DNA1, a gate formed of two gate fingers is arranged at a center portion thereof. This gate is for the MN3 to which the clock signal CK is to be inputted. On each of both sides of this gate for the MN3, a gate formed of three gate fingers is arranged. One gate thereof is for the MN1 to which the Din_p is to be inputted, and the other gate thereof is for the MN2 to which Din_n is to be inputted. In a portion facing the gate for the MN3 so as to interpose the gate for the MN1 therebetween, four gates are sequentially arranged. Each of these gates is for the MNDBK1 to which the OFST_p is to be inputted. In a portion facing the gate for the MN3 so as to interpose the gate for the MN2 therebetween, four gates are sequentially arranged. Each of these gates is for the MNDBK2 to which the OFST_n is to be inputted. A shared diffusion layer between the gate for the MN1 and the gate for the MNDBK1 serves as the node (ap), and a shared diffusion layer between the gate for the MN2 and the gate for the MNDBK2 serves as the node (an). Also, both of a shared diffusion layer between the gate for the MN3 and the gate for the MN1 and a shared diffusion layer between the gate for the MN3 and the gate for the MN2 serve as a node (cm).

In the P-type diffusion layer region DPA1, two gates are arranged adjacent to each other at its center portion. One gate thereof is for the MP1 to which the clock signal CK is to be inputted, and the other gate thereof is for the MP2 to which the CK is to be inputted. A diffusion layer between these two gates is connected to the VDD, a diffusion layer facing this VDD so as to interpose the gate for the MP1 is connected to the node (ap), and a diffusion layer facing this VDD so as to interpose the gate for the MP2 is connected to the node (an). Also, a gate for the dummy is provided adjacent to the gate for the MN1 so as to share the node (ap), and a gate for the dummy is also provided adjacent to the gate for the MN2 so as to share the node (an). These gates for the dummy are connected to the VDD to maintain the off state. By providing the gates for the dummy, the offset voltage accompanied with the variations in process of the MP1 and the MP2 can be reduced as described with FIGS. 10A and 10B or others.

In the P-type diffusion layer region DPA2, two gates are arranged adjacent to each other at a center portion. One gate thereof is for the CIV1 (PMOS) connected to the node (ap), and the other gate thereof is for the CIV2 (PMOS) connected to the node (an). A diffusion layer between these two gates is connected to the VDD, a diffusion layer facing this VDD so as to interpose the gate for the CIV1 (PMOS) is connected to the node (a1$p$), and a diffusion layer facing this VDD so as to interpose the gate for the CIV2 (PMOS) is connected to the node (a1$n$). Also, a gate for the dummy is provided adjacent to the gate for the CIV1 (PMOS) so as to share the node (a1$p$), and a gate for the dummy is also provided adjacent to the gate for the CIV2 (PMOS) so as to share the node (a1$n$). These gates for the dummy are connected to the VDD to maintain the off state. By providing the gates for the dummy, the offset voltage accompanied with the variations in process of the CIV1 (PMOS) and the CIV2 (PMOS) can be reduced as described with FIGS. 10A and 10B or others.

In the N-type diffusion layer region DNA2, two gates are arranged adjacent to each other at a center portion. One gate thereof is for the CIV1 (NMOS) connected to the node (ap), and the other gate thereof is for the CIV2 (NMOS) connected to the node (an). A diffusion layer between these two gates is connected to the VSS, a diffusion layer facing this VSS so as to interpose the gate for the CIV1 (NMOS) is connected to the node (a1$p$), and a diffusion layer facing this VSS so as to interpose the gate for the CIV2 (NMOS) is connected to the node (a1$n$). Also, a gate for the dummy is provided adjacent to the gate for the CIV1 (NMOS) so as to share the node (a1$p$), and a gate for the dummy is also provided adjacent to the gate for the CIV2 (NMOS) so as to share the node (a1$n$). These gates for the dummy are connected to the VSS to maintain the off state. By providing the gates for the dummy, the offset voltage accompanied with the variations in process of the CIV1 (NMOS) and the CIV2 (NMOS) can be reduced as described with FIGS. 10A and 10B or others.

When such an example of the layout structure is used, the offset voltage for the MN1 and the MN2 which are the differential pair can be reduced by the arrangement of the dummy NMOS transistor groups MNDBK1 and MNDBK2, and besides, the offset voltage for the MP1 and the MP2 can also be reduced by the arrangement of the dummy transistors. Note that, also in this case, a minute offset voltage can occur due to a minute imbalance between the MN1 and the MN2 and between the MP1 and the MP2. However, this error can be reduced by inputting the offset-amount setting signals OFST_p and OFST_n to the MNDBK1 and the MNDBK2 and adjusting the offset voltage by these signals. At this time, since the MNDBK1 and the MNDBK2 share diffusion layers with the MN1 and the MN2, accuracy of the adjustment can also be increased. In this manner, the offset voltage can be significantly reduced, and therefore, the high speed of the semiconductor integrated circuit device can be achieved. Further, the MNDBK1 and the MNDBK2 perform both of a function as the dummy transistor and a function for the offset voltage adjustment, and therefore, the area can also be decreased.

As described above, by using the semiconductor integrated circuit device of the second embodiment, typically, the high speed can be achieved with the reduction of the offset voltage. Also, the reduction of the offset voltage can be achieved in a small area.

(Third Embodiment)

A third embodiment describes a a1$n$ (decision feedback-type equalizer) to which the flip-flop circuit described in the second embodiment is applied. For example, in an optical transmission system of a class of several tens of Gbps, it is known that inter symbol interference called ISI occurs in a process from a transmitting unit via a transmission line to a receiving unit. For example, when the transmitting unit outputs a data signal with the "H" level in a cycle T[0] and outputs a data signal with the "L" level in a next cycle T[1], the "H" level in T[0] interferes with T[1] at a predetermined ratio, and therefore, a signal actually received in T[1] by the receiving unit is a signal obtained by adding this interfering signal to the data signal with the "L" level.

The DFE is a circuit which removes such an inter symbol interference and identifies a correct data signal. More specifically, for example, in the receiving unit, the above-described "H" level in T[0] is fed back at the predetermined ratio, and a signal obtained by subtracting this fed-back signal from the data signal with the "L" level is judged in T[1], so that the correct data signal can be identified in principle. An example of a structure of the DFE using such a method is described below.

Figure 7:
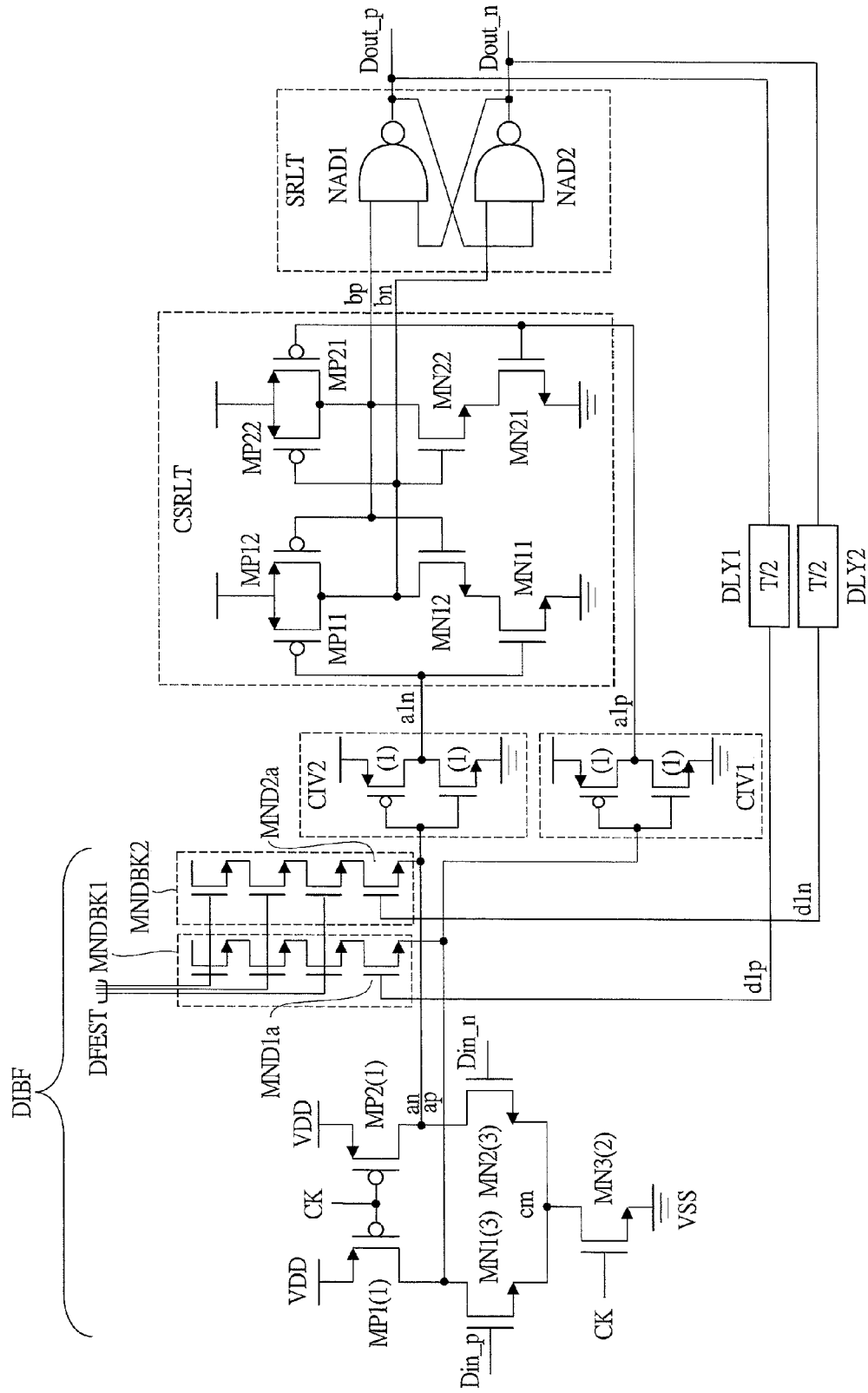
FIG. 7 is a circuit diagram illustrating an example of a structure of a semiconductor integrated circuit device according to a third embodiment of the present invention.

FIG. 7 is a circuit diagram illustrating an example of a structure of the semiconductor integrated circuit device according to the third embodiment of the present invention. Similarly to FIG. 4, the semiconductor integrated circuit device illustrated in FIG. 7 includes: a CMOS-type data input circuit DIBF; CMOS inverter circuits CIV1 and CIV2; a CMOS-type SR latch circuit CSRLT; and an SR latch circuit SRLT. An inner structure of each circuit is similar to that of FIG. 4, and the layout structures of DIBF and CIV1 and CIV2 are also similar to those of FIG. 6. However, the semiconductor integrated circuit device illustrated in FIG. 7 is different from the example of the structure of FIG. 4 in that a feedback path including delay circuits DLY1 and DLY2 are added.

The delay circuit DLY1 takes one (Dout_p) of the differential output signals as an input, delays the input by T/2 (T is one clock cycle time), and then, feeds back the delayed signal to the dummy NMOS transistor group MNDBK1 as an output. The MNDBK1 includes: a dummy NMOS transistor MND1a whose source is connected to the node (ap); and a plurality of dummy NMOS transistors each (sequentially assumed to be MND1b, MND1c, . . . ) whose source-drain path is connected in series to a drain of the dummy NMOS transistor. A feedback signal from the DLY1 is inputted to the gate of this MND1a.

Similarly, the delay circuit DLY2 takes the other one (Dout_n) of the differential output signals as an input, delays the input by T/2, and then, feeds back the delayed signal to the dummy NMOS transistor group MNDBK2 as an output. The MNDBK2 includes: a dummy NMOS transistor MND2a whose source is connected to the node (an); and a plurality of dummy NMOS transistors each (sequentially assumed to be MND2b, MND2c, . . . ) whose source-drain path is connected in series to a drain of the dummy NMOS transistor. A feedback signal from the DLY2 is inputted to the gate of this MND2a.

Also, the MND1b and the MND2b, the MND1c and the MND2c, are controlled by common gate signals, respectively. These gate signals are DFE-amount setting signals DFEST for determining a capacitance value (that is an offset amount) connected to the node (ap) or the node (an). The capacitance value determined with this DFEST is determined based on what ratio of a data in a previous cycle interferes with a data in a target cycle.

Figure 8:
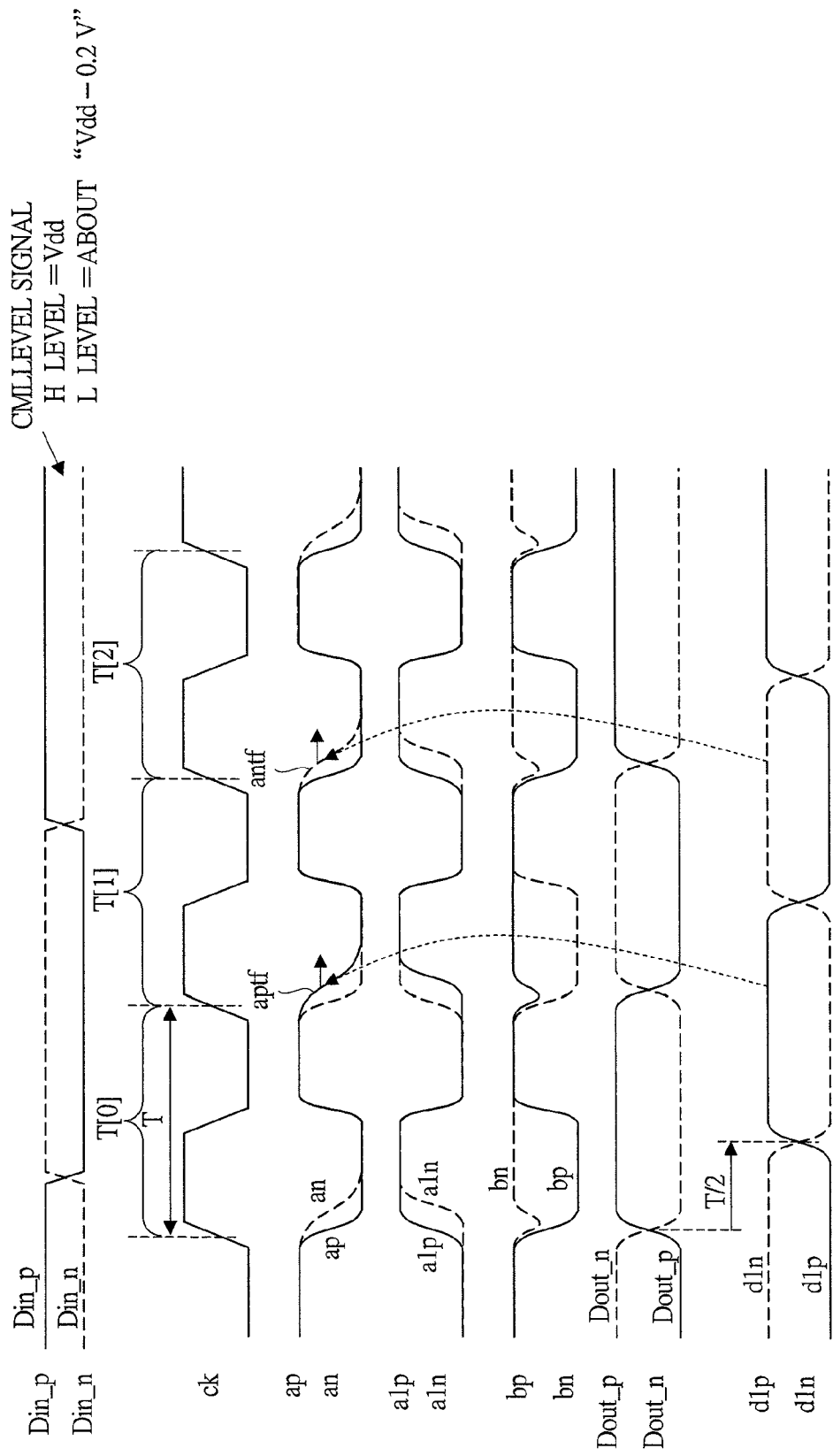
FIG. 8 is a waveform diagram illustrating an example of operation of the semiconductor integrated circuit device of FIG. 7.

FIG. 8 is a waveform diagram illustrating an example of operation of the semiconductor integrated circuit device of FIG. 7. The operation illustrated in FIG. 8 is obtained by adding operation by the feedback path to the operation described in FIG. 5. As illustrated in FIG. 8, for example, when the differential output signals Dout_p and Dout_n transit to the "H" level and the "L" level in the cycle T[0], respectively, the delay by T/2 starts from that time, an output node (dip) of the DLY1 transits to the "H" level, and an output node (din) of the DLY2 transit to the "L" level. Then, in response to the "H" level of the node (d1p), the MND1a is turned on, and a capacitor is provided to the node (ap). In this manner, in the next cycle T[1], a discharge speed (aptf) of the node (ap) can be slowed more than that without the provision of the capacitor to the node (ap).

That is, when the "H" level of the Din_p is latched in T[0] to output the "H" level from the Dout_p, a level obtained by adding the "H" level of the Din_p in T[0] into a correct level at a predetermined ratio is inputted to the Din_p in T[1]. As a result, the discharge speed of the node (ap) becomes excessively fast, and therefore, there is a risk that an input margin in the CSRLT is decreased. Accordingly, as described above, by providing the capacitor to the node (ap), this excessively-fast discharge speed can be returned to an original state. In this manner, the input margin in the CSRLT can be ensured, and besides, the influence of the inter symbol interference can be equivalently removed to allow the latch operation based on the correct level.

Similarly, when the Dout_p and the Dout_n transit to the "L" level and the "H" level in the subsequent cycle T[1], respectively, the delay by T/2 starts from that time, and the output node (dip) of the DLY1 transits to the "L" level, and the output node (din) of the DLY2 transits to the "H" level. Then, in response to the "H" level of the node (din), the MND2a is turned on, and a capacitor is provided to the node (an). In this manner, in a next cycle T[2], a discharge speed (antf) of the node (an) can be slowed more than that without the provision of the capacitor to the node (an).

That is, when the "H" level of the $Din_{13}n$ is latched in T[1] to output the "H" level from the Dout_n, a level obtained by adding the "H" level of the Din_n in T[1] into a correct level at a predetermined ratio is inputted to the Din_n in T[2]. As a result, the discharge speed of the node (an) becomes excessively fast, and therefore, there is a risk that the input margin in the CSRLT is decreased. Accordingly, by providing the capacitor to the node (an), this excessively-fast discharge speed can be returned to an original state. In this manner, the input margin in the CSRLT can be ensured, and besides, the influence of the inter symbol interference can be equivalently removed to allow the latch operation based on the correct level.

By using such a DFE, the offset voltage can be adjusted dynamically at a high speed in addition to various effects described in the second embodiment. A main purpose of this dynamic adjustment is not to bring the offset voltage closer to zero as the second embodiment but to cancel the inter symbol interference, and a method of actively adding the offset voltage is used as means for the purpose. In this case, it is required to provide the capacitor at the high speed to either one of the nodes (an and ap) in accordance with the symbol in the previous cycle. In the third embodiment, as illustrated in FIGS. 6 and 7, the dummy NMOS transistors MND1a and MND2a are arranged so as to share the diffusion layers of the nodes (an and ap), and therefore, the capacitor can be provided to the corresponding node at the high speed as described also in the first embodiment.

As described above, by using the semiconductor integrated circuit device of the third embodiment, typically, the offset voltage can be adjusted in the small area. Further, the offset voltage can be adjusted dynamically at the high speed. Note that, while the capacitance values to be provided to the respective nodes (an and ap) are the same as each other in FIG. 7, these capacitance values may be differentiated from each other. For example, if this difference is set so as to be the component of the DC offset voltage, the offset voltage in the initial state without the inter symbol interference can also be significantly reduced as described in the second embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the foregoing description shows the example of the structure in accordance with the differential input signal. However, in some case, the present invention can be also applied as a technique of adding the offset voltage at a high speed to a single input signal. That is, for example, when the structure on only one side (MD1 and MND1) in FIGS. 1A and 1B is used, the offset voltage can be added at the highspeed to the single input signal.

While the semiconductor integrated circuit device according to the present embodiment is more particularly a technique effectively applied to a semiconductor integrated circuit device including a differential circuit operated by a high-speed differential signal, this is not limited to this, and can be widely applied as a technique of adding an offset voltage to a signal.

C capacitor
CIV CMOS inverter circuit
CK clock signal
CSRLT CMOS-type SR latch circuit
DIBF data input circuit
DLY delay circuit
DN N-type diffusion layer
DNA N-type diffusion layer region
DP P-type diffusion layer
DPA P-type diffusion layer region
Din input signal
Do, Dout output signal
GT gate
IS current source
MN NMOS transistor
MND dummy NMOS transistor
MNDBK dummy NMOS transistor group
MP PMOS transistor
NAD NAND circuit
OFST offset-amount setting signal
S source
SRLT SR latch circuit
STI insulating layer
SUB semiconductor substrate
VDD power supply voltage
VSS reference power supply voltage

The invention claimed is:

1. A semiconductor integrated circuit device comprising:
a common source region;
N (N≥1) first gate layers and M (M≥1) third gate layers arranged so as to extend in a first direction and align sequentially starting from the common source region toward a second direction which is orthogonal to the first direction;
N second gate layers and M fourth gate layers arranged so as to extend in the first direction and align sequentially starting from the common source region toward a third direction which is parallel, and opposite, to the second direction;
a first diffusion layer which is arranged between the N first gate layers and the M third gate layers and which serves as a shared diffusion layer between the N first gate layers and the M third gate layers;
a third diffusion layer which faces the first diffusion layer such that the M third gate layers are interposed therebetween;
a second diffusion layer which is arranged between the N second gate layers and the M fourth gate layers and which serves as a shared diffusion layer between the N second gate layers and the M fourth gate layers; and
a fourth diffusion layer which faces the second diffusion layer such that the M fourth gate layers are interposed therebetween, wherein
the N first gate layers are gate fingers of a first MIS transistor and take a first differential input signal as an input,
the N second gate layers are gate fingers of a second MIS transistor and take a second differential input signal as an input,
the first diffusion layer is a drain of the first MIS transistor,
the second diffusion layer is a drain of the second MIS transistor, and
both of the third and the fourth diffusion layers are unconnected.

2. The semiconductor integrated circuit device according to claim 1,
wherein, when a first voltage is applied to the third gate layer, a second voltage different from the first voltage is applied to the fourth gate layer.

3. The semiconductor integrated circuit device according to claim 1, wherein
the semiconductor integrated circuit device can select a voltage to be applied to each of the M third gate layers and a voltage to be applied to each of the M fourth gate layers from among two or more voltage values for each layer.

4. The semiconductor integrated circuit device according to claim 1, wherein
the N is an odd number.

5. A semiconductor integrated circuit device comprising:
a first MIS transistor of a first conductive type to whose gate a first differential input signal is inputted;
a second MIS transistor of the first conductive type to whose gate a second differential input signal is inputted;
a plurality of third MIS transistors of the first conductive type whose source-drain paths are connected in series; and
a plurality of fourth MIS transistors of the first conductive type whose source-drain paths are connected in series, wherein
one end of a series connection path formed of the plurality of third MIS transistors is connected to a drain of the first MIS transistor and the other end thereof is unconnected, and
one end of a series connection path formed of the plurality of fourth MIS transistors is connected to a drain of the second MIS transistor and the other end thereof is unconnected.

6. The semiconductor integrated circuit device according to claim 5, wherein
one of the plurality of third MIS transistors is a third A transistor whose source or drain is connected to the drain of the first MIS transistor,
one of the plurality of fourth MIS transistors is a fourth A transistor whose source or drain is connected to the drain of the second MIS transistor, and
the third A transistor and the fourth A transistor are controlled so that either one of them is turned on and the other is turned off.

7. The semiconductor integrated circuit device according to claim 6, wherein
the semiconductor integrated circuit device can select and apply either a first gate voltage for the control to turn on or a second gate voltage for the control to turn off to each gate of the plurality of third MIS transistors and the plurality of fourth MIS transistors.

8. The semiconductor integrated circuit device according to claim 6, wherein
the drain of the first MIS transistor and either the source or the drain of the third A transistor are formed of a common diffusion layer, and
the drain of the second MIS transistor and either the source or the drain of the fourth A transistor are formed of a common diffusion layer.

9. The semiconductor integrated circuit device according to claim 5, wherein
each of the first and the second MIS transistors is configured of N gate fingers, the N being an odd number of three or larger, and
each gate length and each gate width of the plurality of third MIS transistors and the plurality of fourth MIS transistors are equal to a gate length and a gate width of each gate finger of the N gate fingers.

10. A semiconductor integrated circuit device comprising:
first and second nodes;
a first MIS transistor of a first conductive type to whose gate a first differential input signal is inputted and whose drain is connected to the first node;
a second MIS transistor of the first conductive type to whose gate a second differential input signal is inputted, whose drain is connected to the second node, and whose source is commonly connected to a source of the first MIS transistor;
a plurality of third MIS transistors of the first conductive type whose source-drain paths are connected in series, one end of the series connection path is connected to the first node and the other end thereof is unconnected;
a plurality of fourth MIS transistors of the first conductive type whose source-drain paths are connected in series, one end of the series connection path is connected to the second node and the other end thereof is unconnected;
a fifth MIS transistor of the first conductive type for connecting the common source node of the first and the second MIS transistors to a first voltage when a clock signal is at a first logic level;
sixth and seventh MIS transistors for connecting the first and the second nodes to a second voltage when the clock signal is at a second logic level; and
a latch circuit unit for detecting which one of the first node and the second node is first changed from the second voltage to the first voltage in accordance with the differential input signals when the clock signal transits from the second logic level to the first logic level and latching information about the detection.

11. The semiconductor integrated circuit device according to claim 10, wherein
one of the plurality of third MIS transistors is a third A transistor whose source or drain is connected to the first node,
one of the plurality of fourth MIS transistors is a fourth A transistor whose source or drain is connected to the second node, and
the third A transistor and the fourth A transistor are controlled so that either one of them is turned on and the other is turned off.

12. The semiconductor integrated circuit device according to claim 11, wherein
the drain of the first MIS transistor and either the source or the drain of the third A transistor are formed of a common diffusion layer, and
the drain of the second MIS transistor and either the source or the drain of the fourth A transistor are formed of a common diffusion layer.

13. The semiconductor integrated circuit device according to claim 12, wherein
each of the first and the second MIS transistors is configured of N gate fingers, the N being an odd number of three or larger, and
each gate length and each gate width of the plurality of third MIS transistors and the plurality of fourth MIS transistors are equal to a gate length and a gate width of each gate finger of the N gate fingers.

14. The semiconductor integrated circuit device according to claim 10, wherein the latch circuit unit includes:
a first inverter circuit taking the first node as an input signal and outputting an inversion signal of the input signal to a third node;
a second inverter circuit taking the second node as an input signal and outputting an inversion signal of the input signal to a fourth node;
a CMOS-type latch circuit taking the third node and the fourth node as input signals and outputting the input signals to a fifth node and a sixth node; and
an SR latch circuit taking the fifth node and the sixth node as input signals and outputting the input signals to a seventh node and an eighth node, and the CMOS-type latch circuit includes:
an eighth MIS transistor of the first conductive type and a ninth MIS transistor of a second conductive type whose gates are connected to the third node;
a tenth MIS transistor of the first conductive type and an eleventh MIS transistor of the second conductive type whose gates are connected to the fourth node;
a twelfth MIS transistor of the first conductive type whose source is connected to a drain of the eighth MIS transistor and whose drain is connected to a drain of the ninth MIS transistor;
a thirteenth MIS transistor of the second conductive type whose source and drain are connected to a source and a drain of the ninth MIS transistor;
a fourteenth MIS transistor of the first conductive type whose source is connected to a drain of the tenth MIS transistor and whose drain is connected to a drain of the eleventh MIS transistor; and
a fifteenth MIS transistor of the second conductive type whose source and drain are connected to a source and a drain of the eleventh MIS transistor,
gates of the twelfth and the thirteenth MIS transistors and the drain of the fourteenth MIS transistor are connected to the fifth node, and
gates of the fourteenth and the fifteenth MIS transistors and the drain of the twelfth MIS transistor are connected to the sixth node.

15. A semiconductor integrated circuit device comprising:
first and second nodes;
a first MIS transistor of a first conductive type to whose gate a first differential input signal is inputted and whose drain is connected to the first node;
a second MIS transistor of the first conductive type to whose gate a second differential input signal is inputted, whose drain is connected to the second node, and whose source is commonly connected to a source of the first MIS transistor;

a plurality of third MIS transistors of the first conductive type whose source-drain paths are connected in series, one end of the series connection path is connected to the first node and the other end thereof is unconnected;

a plurality of fourth MIS transistors of the first conductive type whose source-drain paths are connected in series, one end of the series connection path is connected to the second node and the other end thereof is unconnected;

a fifth MIS transistor of the first conductive type for connecting the common source node of the first and the second MIS transistors to a first voltage when a clock signal is at a first logic level;

sixth and seventh MIS transistors for connecting the first and the second nodes to a second voltage when the clock signal is at a second logic level; and a latch circuit unit for detecting which one of the first node and the second node is first changed from the second voltage to the first voltage in accordance with the differential input signals when the clock signal transits from the second logic level to the first logic level and latching information about the detection, wherein one of the plurality of third MIS transistors is a third A transistor whose source or drain is connected to the first node, one of the plurality of fourth MIS transistors is a fourth A transistor whose source or drain is connected to the second node, and the third A transistor and the fourth A transistor are controlled so that one of them is turned on and the other is turned off based on a latch data of the latch circuit unit.

16. The semiconductor integrated circuit device according to claim 15, wherein the drain of the first MIS transistor and either the source or the drain of the third A transistor are formed of a common diffusion layer, and the drain of the second MIS transistor and either the source or the drain of the fourth A transistor are formed of a common diffusion layer.

17. The semiconductor integrated circuit device according to claim 16, wherein each of the first and the second MIS transistors is configured of N gate fingers, the N being an odd number of three or larger, and each gate length and each gate width of the plurality of third MIS transistors and the plurality of fourth MIS transistors are equal to a gate length and a gate width of each gate finger of the N gate fingers.

18. The semiconductor integrated circuit device according to claim 15, wherein the latch circuit unit includes:

a first inverter circuit taking the first node as an input signal and outputting an inversion signal of the input signal to a third node;

a second inverter circuit taking the second node as an input signal and outputting an inversion signal of the input signal to a fourth node;

a CMOS-type latch circuit taking the third node and the fourth node as input signals and outputting the input signals to a fifth node and a sixth node; and an SR latch circuit taking the fifth node and the sixth node as input signals and outputting the input signals to a seventh node and an eighth node, and the CMOS-type latch circuit includes:

an eighth MIS transistor of the first conductive type and a ninth MIS transistor of a second conductive type whose gates are connected to the third node;

a tenth MIS transistor of the first conductive type and an eleventh MIS transistor of the second conductive type whose gates are connected to the fourth node;

a twelfth MIS transistor of the first conductive type whose source is connected to a drain of the eighth MIS transistor and whose drain is connected to a drain of the ninth MIS transistor;

a thirteenth MIS transistor of the second conductive type whose source and drain are connected to a source and a drain of the ninth MIS transistor;

a fourteenth MIS transistor of the first conductive type whose source is connected to a drain of the tenth MIS transistor and whose drain is connected to a drain of the eleventh MIS transistor; and a fifteenth MIS transistor of the second conductive type whose source and drain are connected to a source and a drain of the eleventh MIS transistor, gates of the twelfth and the thirteenth MIS transistors and the drain of the fourteenth MIS transistor are connected to the fifth node, and gates of the fourteenth and the fifteenth MIS transistors and the drain of the twelfth MIS transistor are connected to the sixth node.

\* \* \* \* \*